(12) United States Patent
Tanaka

(10) Patent No.: US 6,650,207 B1
(45) Date of Patent: Nov. 18, 2003

(54) LONGITUDINALLY COUPLED SURFACE ACOUSTIC WAVE FILTER WITH LINEARLY WEIGHTED REFLECTORS

(75) Inventor: Hiroshi Tanaka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/019,024

(22) PCT Filed: Apr. 24, 2000

(86) PCT No.: PCT/JP00/02651
§ 371 (c)(1),
(2), (4) Date: Dec. 26, 2001

(87) PCT Pub. No.: WO01/82480
PCT Pub. Date: Nov. 1, 2001

(51) Int. Cl.[7] .............................. H03H 9/64; H03H 9/25
(52) U.S. Cl. ........................ 333/195; 333/194; 333/196; 310/313 D
(58) Field of Search .................... 333/193–196; 310/313 R, 313 B, 313 C, 313 D

(56) References Cited

U.S. PATENT DOCUMENTS 4,350,963 A * 9/1982 Iwamoto et al. ............ 333/151
4,803,448 A * 2/1989 Zibis et al. ................. 333/151
5,705,964 A * 1/1998 Tera et al. ................... 333/193

FOREIGN PATENT DOCUMENTS

| JP | 57-208719 | * 12/1982 | ............ 310/313 R |
| JP | 59-200519 | * 11/1984 | |
| JP | 61-4316 | 1/1985 | |
| JP | 3-128519 | 5/1991 | |
| JP | 4-40705 | 2/1992 | |
| JP | 5-251984 | 9/1993 | |

* cited by examiner

Primary Examiner—Barbara Summons
(74) Attorney, Agent, or Firm—Oblon, Spivak, McClelland, Maier & Neustadt, P.C.

(57) ABSTRACT

In a longitudinally coupled multi-mode surface acoustic wave filter which has an assembly of more than two interdigital transducers formed on a piezoelectric substrate and reflectors composed of shorted grating electrodes different in pitch from the IDTs. The grating electrodes are weighted so that their numbers vary linearly with the position in the direction perpendicular to the direction of propagation of surface acoustic waves.

3 Claims, 12 Drawing Sheets

SPURIOUS

SPURIOUS

SPURIOUS

SPURIOUS

LONGITUDINALLY COUPLED SURFACE ACOUSTIC WAVE FILTER WITH LINEARLY WEIGHTED REFLECTORS

TECHNICAL FIELD

The present invention relates to a surface acoustic wave filter for use in a high-frequency circuit of a mobile communication device typified, for example, by a portable telephone or car telephone and, more particularly, to an easy-to-manufacture surface acoustic wave filter that has an excellent attenuation characteristic in the neighborhood of its pass band.

BACKGROUND ART

A resonator type surface acoustic wave (hereinafter referred to as SAW) filter is provided with reflectors on both sides of each interdigital transducer (IDT) to reflect surface acoustic waves, thereby generating standing waves.

With the provision of such reflectors, sawtooth or spike-like spurious pulses develop in the vicinity of the pass band—this is attributable to the reflectors. The sizes and shapes of these spurious pulses depend on the configuration of the SAW filter, such as the number of IDTs used and the IDT spacing.

Further, in recent portable telephone or similar mobile communication systems the necessity for effective use of available frequency has lessened the space between transmitting and receiving frequency bands, that is, what is called a transition bandwidth, and there is the growing demand for SAW filters which provide increased transmission attenuation in the neighborhood of the pass band in such mobile communication systems.

FIG. 20 depicts a transversely-coupled, dual mode SAW filter disclosed in Japanese Patent Application Laid-Open Gazette No. 128519/91. This SAW filter has two resonators 201 and 202 disposed on a piezoelectric substrate (made principally of crystal) 200 across the direction of propagation of surface acoustic waves. The resonators 201 and 202 have reflectors 206 to 209 on both sides of interdigital transducers (IDTs) 203 and 204, and are excited in fundamental and second-order modes. Each reflector is graded or weighted by a different number of electrodes arranged in the direction of propagation of surface acoustic waves, thereby suppressing high-order modes and hence providing an improved spurious characteristic.

Incidentally, since the electrodes of the reflectors 203 to 209 in FIG. 20 are weighted along a sine curve, the development of filters encounters much difficulty, for example, in the design of electrode patterns, including simulations and in the creation of data on electrode patterns for use in the fabrication of photomasks.

DISCLOSURE OF THE INVENTION

It is therefore an object of the present invention to provide a SAW filter that permits suppression or elimination of the aforementioned spurious pulses to improve attenuation in the vicinity of the pass band and has an easy-to-develop and fabricate structure.

According to the present invention, there is provided a longitudinal-coupled SAW filter that has at least two interdigital transducers formed over a piezoelectric substrate and reflectors disposed on both sides of the interdigital transducers and in which the reflectors each comprise: a group of electrodes graded so that their number linearly varies with their position in the direction perpendicular to the direction of propagation of surface acoustic waves; and bus bars shorting the electrodes.

Since the electrode groups of the reflectors are graded so that the number of electrodes of each group varies with their position in the direction perpendicular to the direction of propagation of surface acoustic waves, the present invention allows ease in the design and development of the SAW filter, and permits reduction of the spurious pulses and hence provide improved attenuation in the vicinity of the pass band.

BEST MODE FOR CARRYING OUT THE INVENTION

In order to describe the invention in more detail, the preferred embodiments of the invention will now be described with reference to the accompanying drawings.

Embodiment 1

Figure 1:
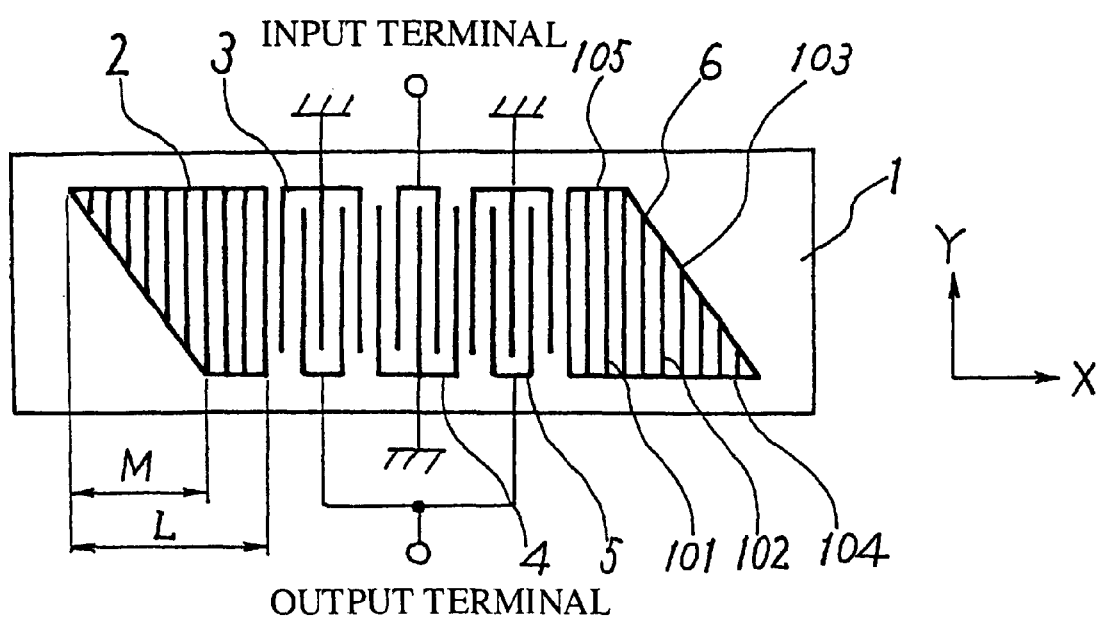
FIG. 1 is a schematic diagram illustrating an embodiment of the SAW filter according to the present invention.

FIG. 1 schematically illustrates a SAW filter according to a first embodiment (Embodiment 1) of the present invention, which is a longitudinally coupled multi-mode SAW filter in which three IDTs 3 to 5 are arranged on a piezoelectric substrate (LiTaO₃, LiNbO₃) 1 capable of exciting surface acoustic waves and reflectors 2 and 6 are disposed on both sides of the IDTs 3 to 5. The two reflectors 2 and 6 each have grating electrodes weighted into trapezoidal form. Surface acoustic waves propagate in the direction indicated by X, and each reflector is weighted so that the number of its electrodes varies linearly with the position in the Y-direction perpendicular to the X-direction. For example, the number of electrodes of the reflector 6 is four at the farthest position and 10 at the nearest position in the Y-direction. The reflector 6 has the electrodes 101 and 102 shorted at both ends by bus bars 103, 104 and 105. The reflector 2 is point-symmetrical in construction to the reflector 6. The reflectors 2 and 6 differ in the pitch of electrodes from the IDTs 3 to 5. Reference character L denotes the length of the reflector in the direction of propagation of surface acoustic waves, and M denotes the length of the weighted or graded portion of the reflector in the direction of propagation of surface acoustic waves.

Figure 2:
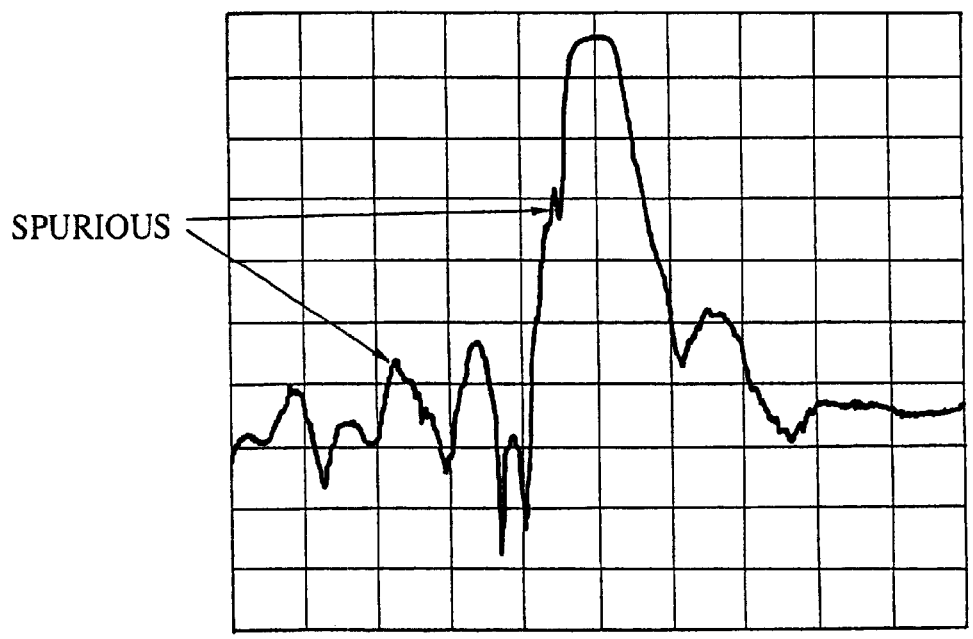
FIG. 2 shows the transmission characteristic of the SAW filter of Embodiment 1 with M/L=0.5.
Figure 3:
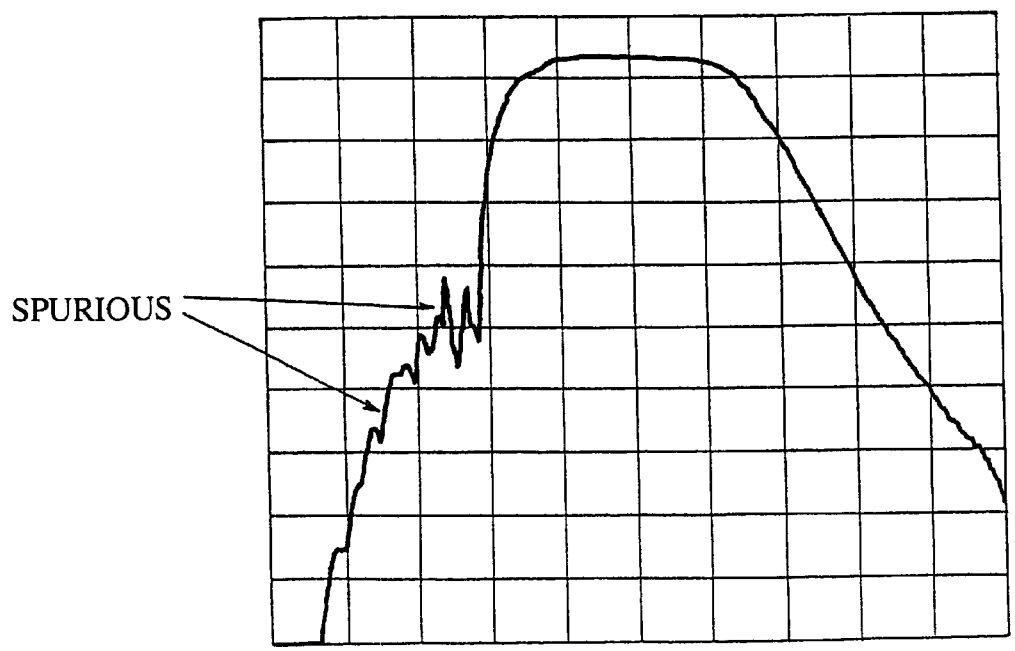
FIG. 3 is a magnified view of FIG. 2.

To confirm the reflector weighting effect, the present inventors built a prototype of a longitudinally coupled multi-mode SAW filter of the FIG. 1 structure in which: the IDTs 3 and 5 each had 22 electrodes;,the IDT 4 had 31 electrodes; the reflectors 2 and 5 each had 146 electrodes; and M/L=0.5. FIG. 2 shows the transmission characteristic of the above-mentioned SAW filter measured over a 500 MHz frequency range from 692.5 to 1192.5 MHz with a 942.5 MHz center frequency. In FIG. 2 the ordinate is graduated to 0 dB in 5 dB increments. FIG. 3 shows the central portion of the FIG. 2 transmission characteristic magnified over a 100 MHz range in the direction of frequency, the abscissa being graduated in terms of 3 dB. The same goes for the ordinates and abscissas in the transmission characteristic diagrams and their magnified versions described hereinafter.

Figure 4:
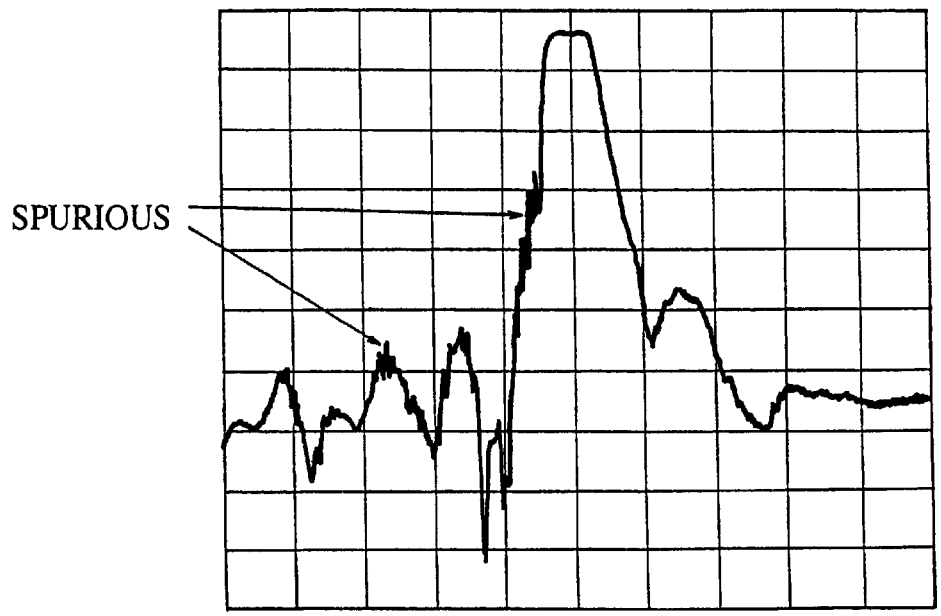
FIG. 4 shows the transmission characteristic of a conventional SAW filter just for comparison use.
Figure 5:
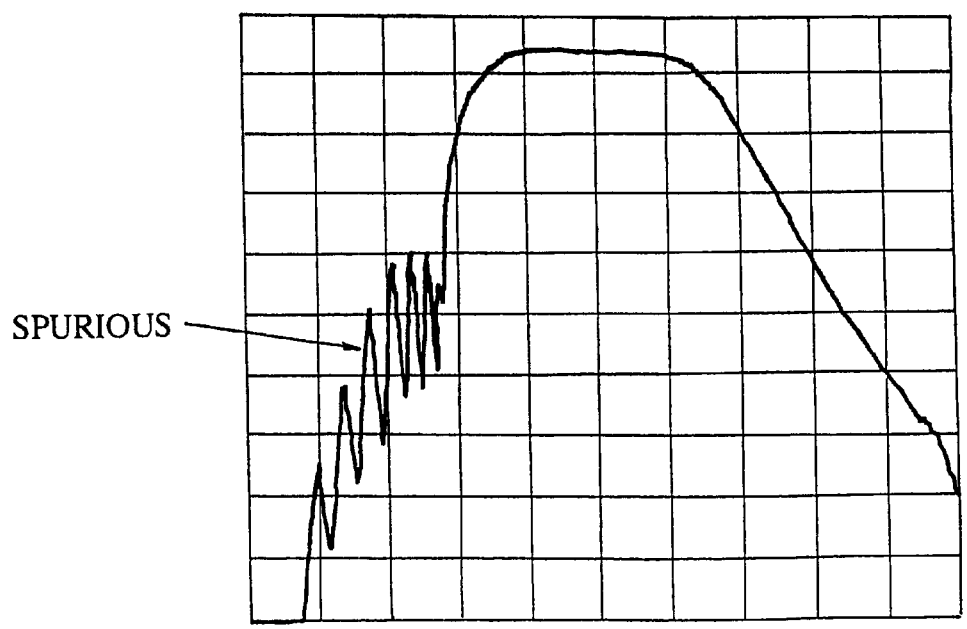
FIG. 5 is a magnified view of FIG. 4.

For comparison with the SAW filter of this embodiment, the inventors produced a longitudinally coupled multi-mode SAW filter of exactly the same construction as that of the SAW filter of this embodiment except that M/L=0, that is, the reflectors were not weighted and hence were rectangular in shape as in the past. FIGS. 4 and 5 show its transmission characteristic. It will be seen that many spike-like spurious pulses are present particularly on the low-frequency side of the pass band in FIG. 4 but that the generation of such spurious pulses is appreciably suppressed in the FIG. 2 transmission characteristic.

Figure 6:
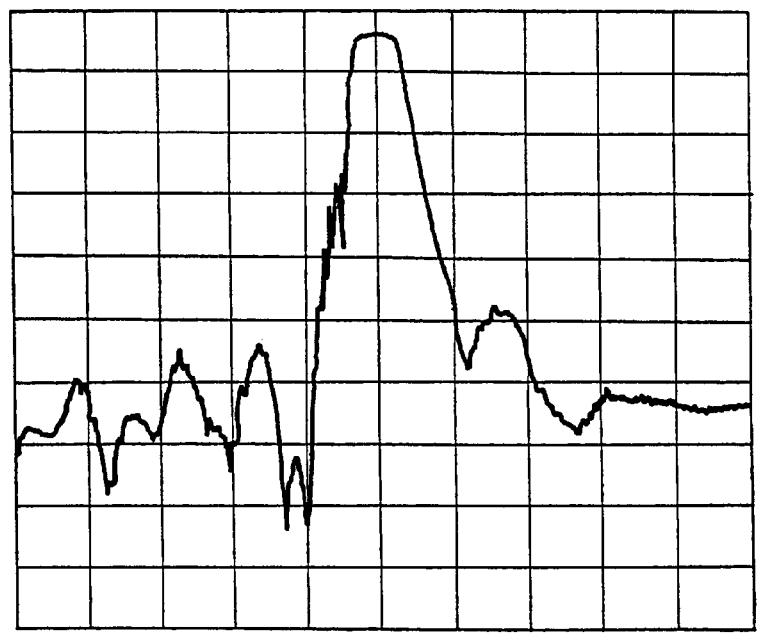
FIG. 6 shows the transmission characteristic of the SAW filter of Embodiment 1 with M/L=0.1.
Figure 7:
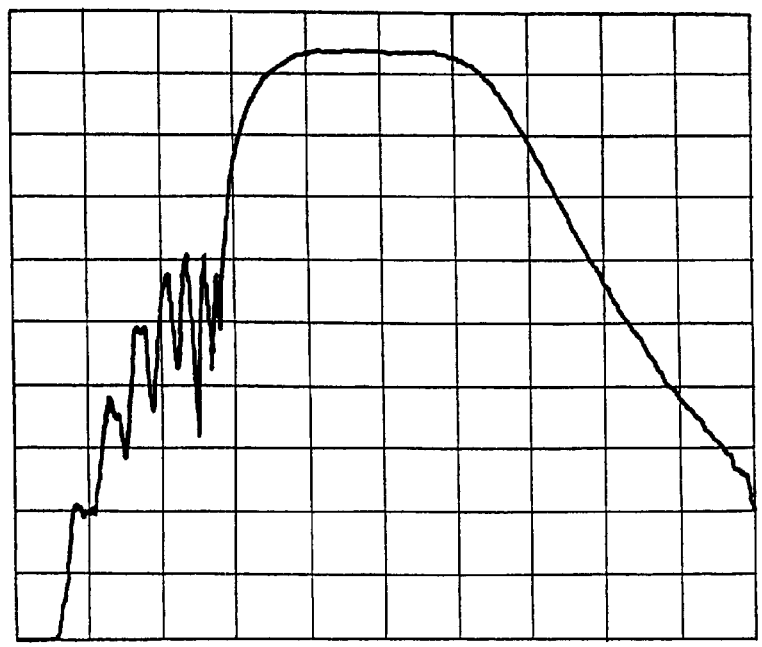
FIG. 7 is a magnified view of FIG. 6.
Figure 8:
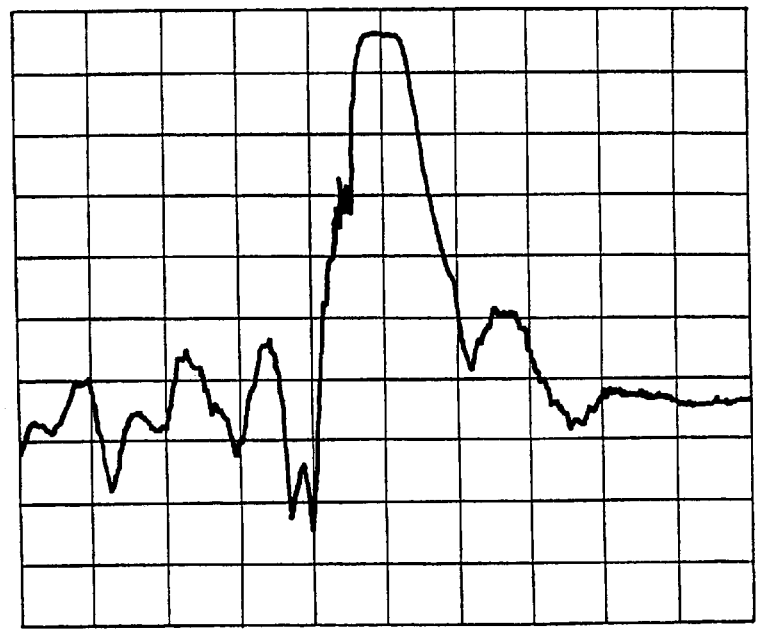
FIG. 8 shows the transmission characteristic of the SAW filter of. Embodiment 1 with M/L=0.3.
Figure 9:
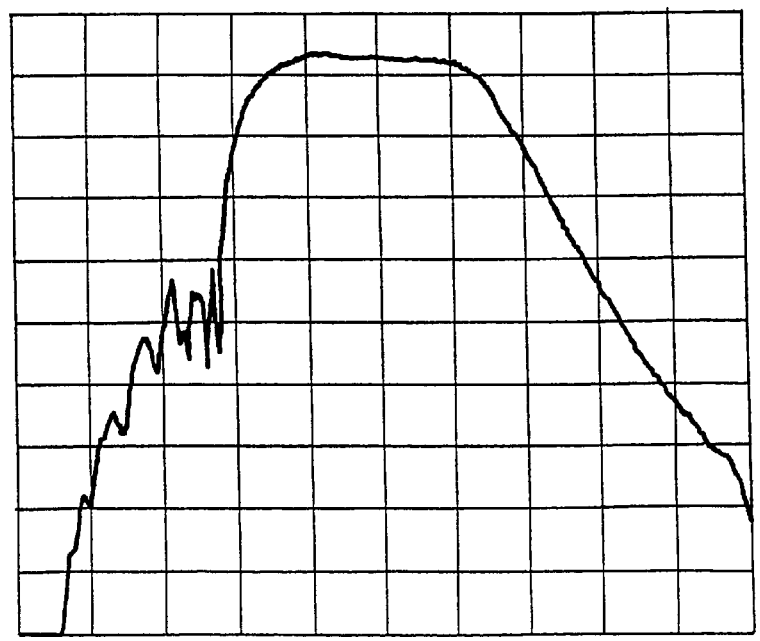
FIG. 9 is a magnified view of FIG. 8.
Figure 10:
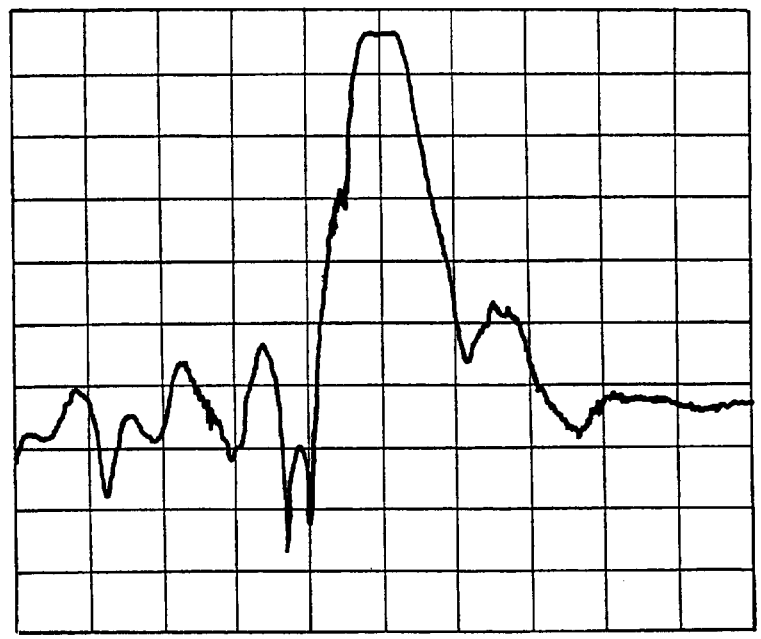
FIG. 10 shows the transmission characteristic of the SAW filter of Embodiment 1 with M/L=0.7.
Figure 11:
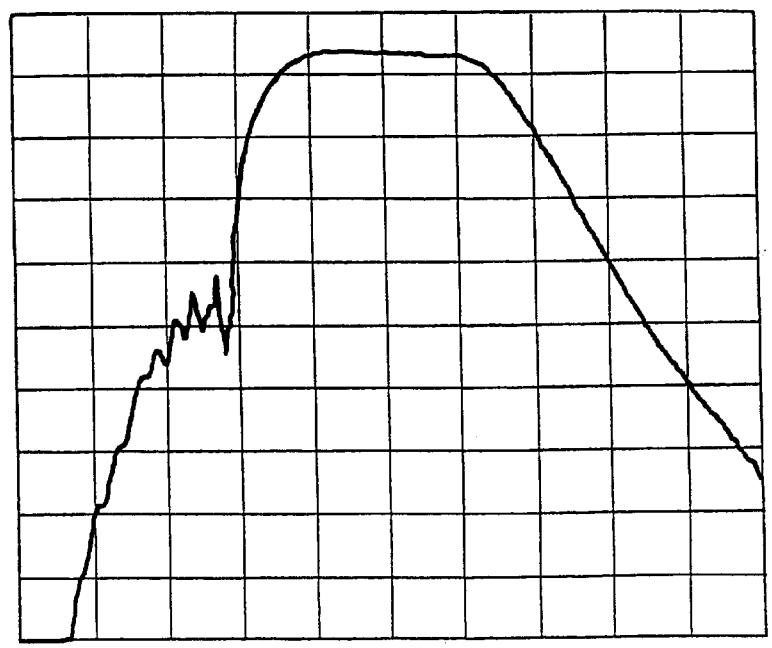
FIG. 11 is a magnified view of FIG. 10.

FIGS. 6 to 11 show measured results of transmission characteristics of SAW filters of exactly the same construction as that of the inventors'prototyped SAW filter except that M/L=0.1, 0.3 and 0.7, respectively. FIGS. 6, 8 and 10 show the transmission characteristics measured in the cases of M/L=0.1, 0.3 and 0.7, respectively, and FIGS. 7, 9 and 11 magnified versions of central portion of the measured characteristics.

As can be seen from FIGS. 6 to 11, the generation of spurious pulses diminishes as in the case of FIG. 2, and since the weighted area of each reflector increases with an increase in the value of M/L, the generation of spurious pulses is suppressed accordingly; in particular, attenuation increases toward the pass band.

To provide a sufficient attenuation in the neighborhood of the pass band, the value of M/L may preferably be 0.3 or more.

Figure 20:
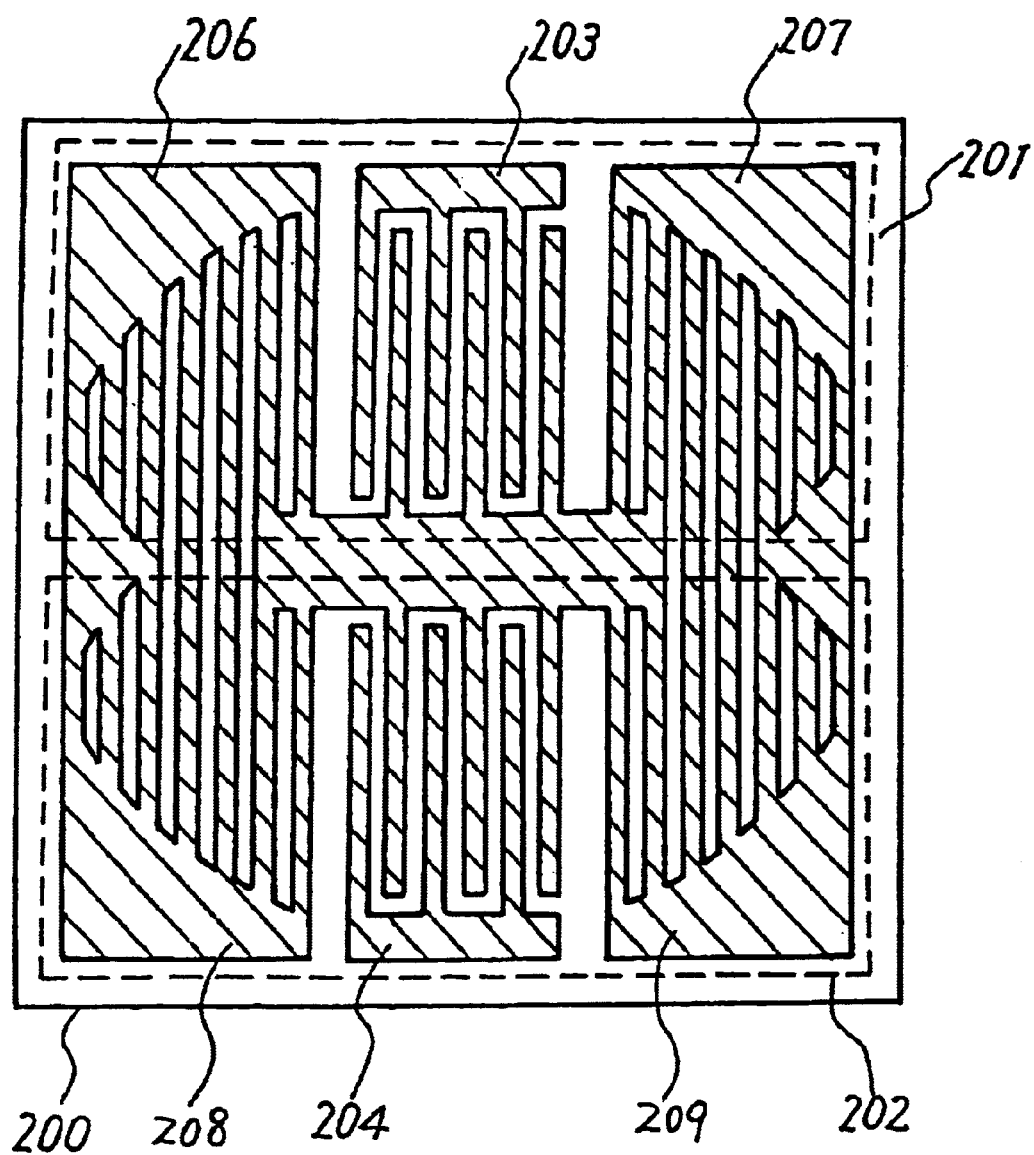
FIG. 20 is a diagram schematically showing an example of a conventional SAW filter.

In the transversely-coupled, dual mode SAW filter of FIG. 20, spurious pulses are generated due to the high-order mode. In contrast thereto, in the longitudinally coupled, dual mode SAW filter as proposed by the present invention, the generation of spurious pulses is attributed to the reflection of waves of frequencies outside the pass band by the reflectors. The longitudinally coupled, dual mode SAW filter differs from the transversely-coupled, dual mode SAW filter in the mechanism of generation of spurious pulses, and hence it has a high degree of flexibility in designing the electrode pattern of the reflector. Accordingly, the electrodes need not be weighted along the sine curve as depicted in FIG. 20, but instead they can be weighted linearly.

Embodiment 2

Figure 12:
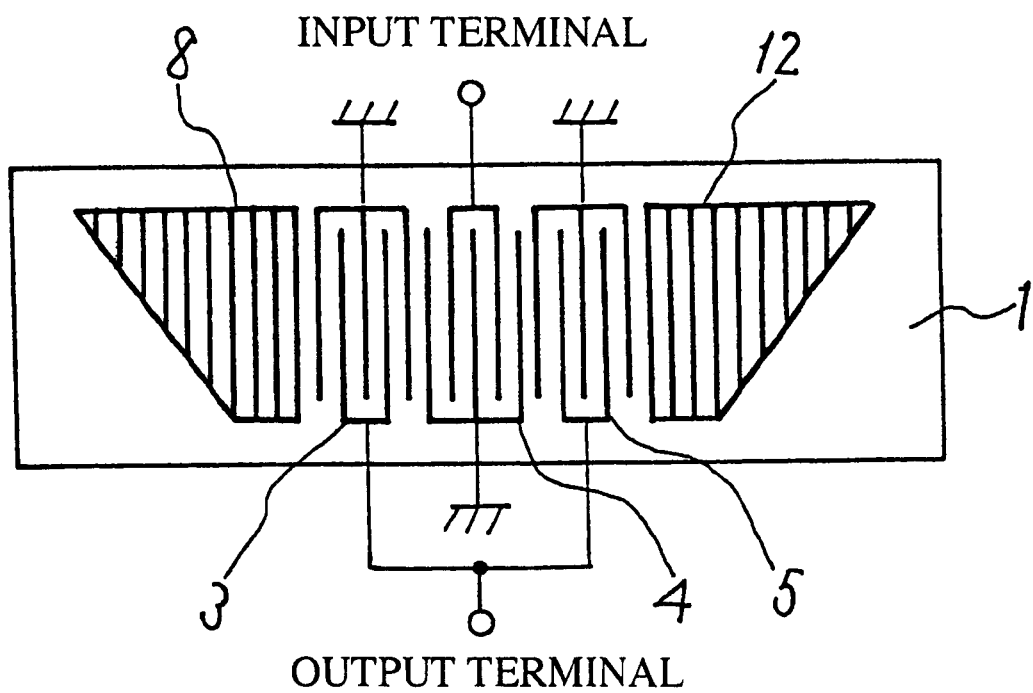
FIG. 12 is a diagram schematically illustrating another embodiment of the SAW filter according to the present invention.

FIG. 12 is a diagrammatic representation of a second embodiment (Embodiment 2) of the present invention, which differs from Embodiment 1 in the shape of the right-hand reflector 12. In Embodiment 1 the two reflectors are weighted so that they are point-symmetric to each other, whereas in Embodiment 2 the reflectors 8 and 12 are weighted so that they are point-symmetric with respect to a line perpendicular to the direction of propagation of surface acoustic waves. This structure also permits suppression of generation of spurious pulses as is the case with Embodiment 1.

Figure 13:
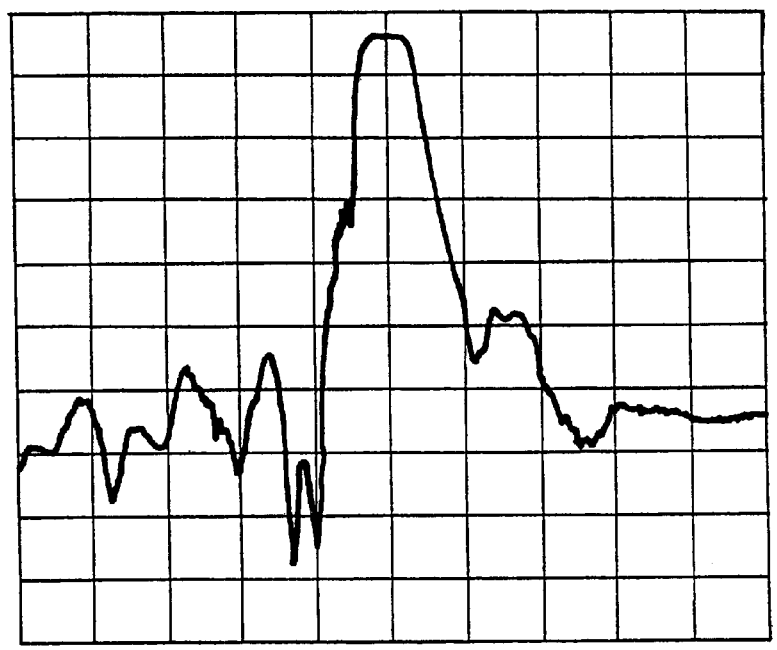
FIG. 13 shows the transmission characteristic of the SAW filter of the FIG. 12 embodiment with M/L=0.5.
Figure 14:
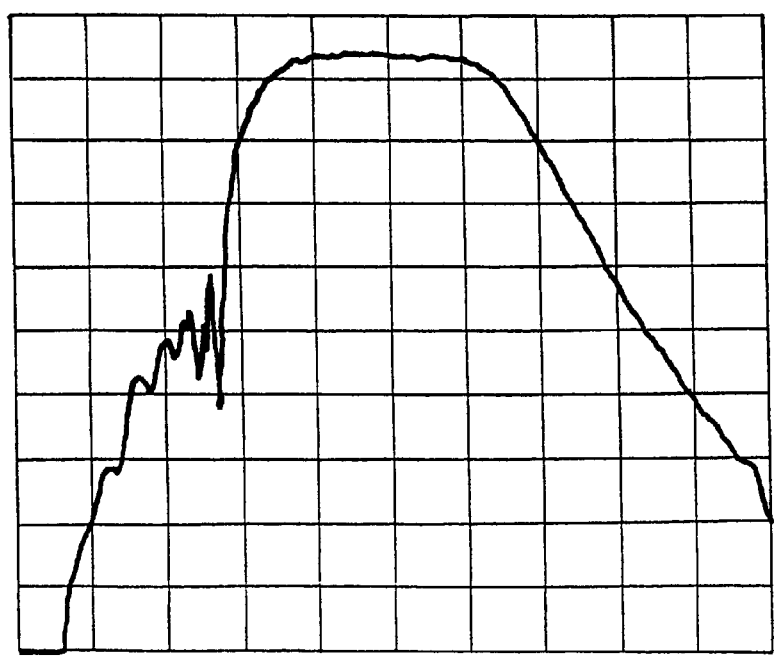
FIG. 14 is a magnified view of FIG. 13.

FIG. 13 shows a measured transmission characteristic of the longitudinally coupled, multi-mode SAW filter according to this embodiment with M/L=0.5. FIG. 14 depicts a magnified central portion of the measured characteristic. The numbers of electrodes of each IDT and each reflector are the same as in Embodiment 1.

From FIG. 13 it is evident that the structure of this embodiment effectively suppresses the generation of spurious pulses. Further, it can be seen that since the weighted reflector 12 differ in shape from the counterpart in FIG. 2, spurious pulses also somewhat differ in shape although they are suppressed to the same extent as in the FIG. 2 embodiment.

Moreover, even if the two reflectors are weighted as if they were flipped vertically into trapezoidal form, the spurious pulses can similarly be suppressed.

Embodiment 3

Figure 15:
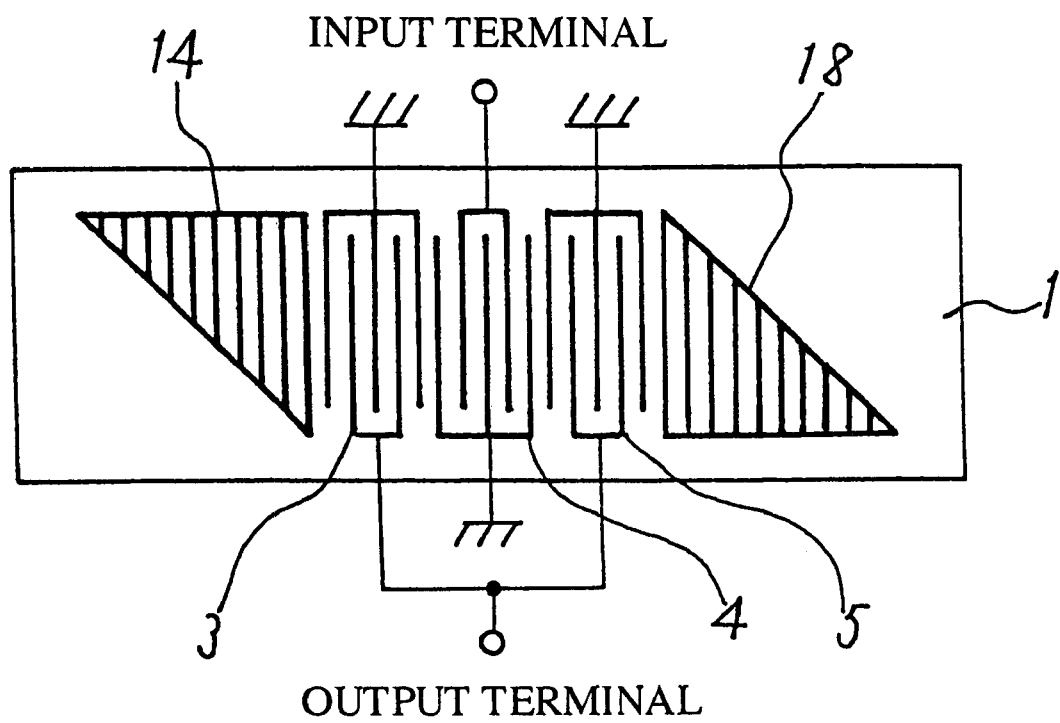
FIG. 15 is a diagram schematically illustrating another embodiment of the SAW filter according to the present invention.

FIG. 15 is a diagrammatic showing of a third embodiment (Embodiment 3) of the present invention. This is a modified form of Embodiment 1, in which M/L=1 and consequently reflectors 14 and 18 are weighted so that they are triangular.

Figure 16:
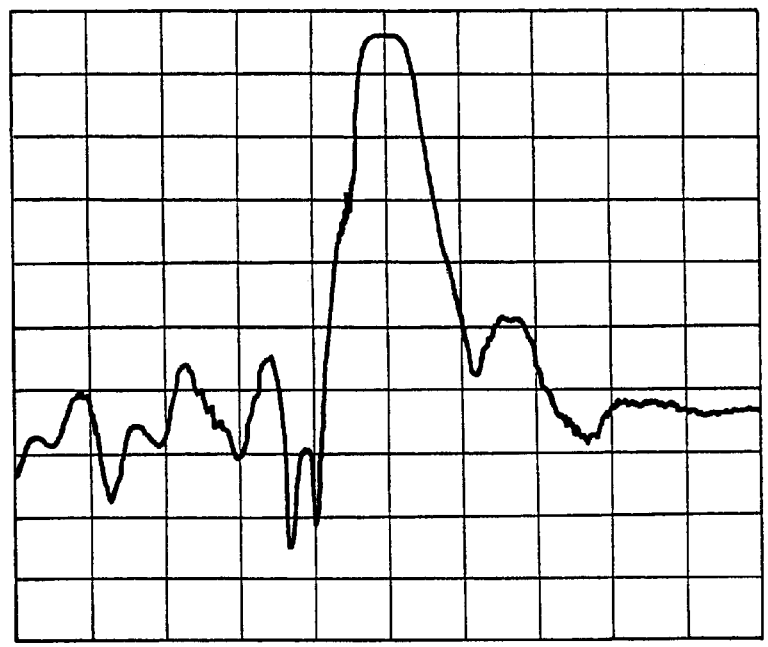
FIG. 16 shows the transmission characteristic of the SAW filter of the FIG. 15.
Figure 17:
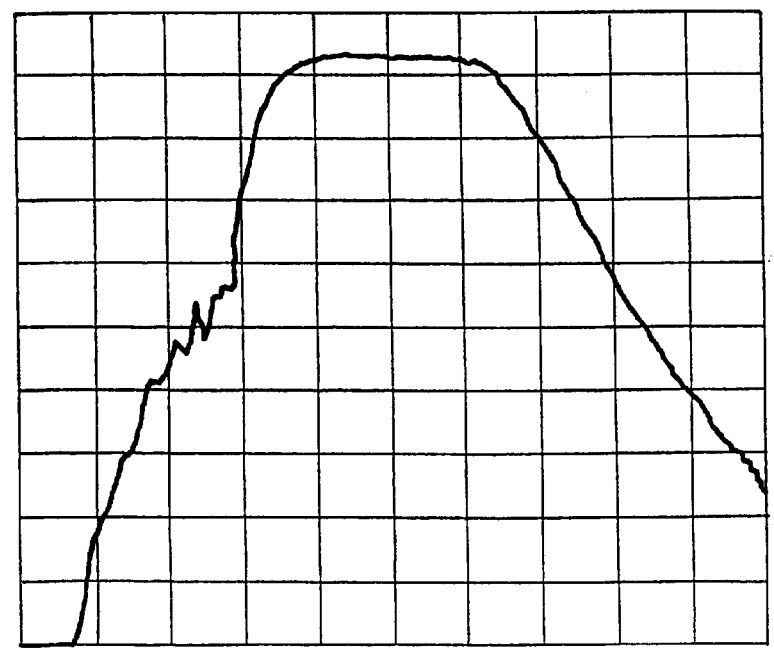
FIG. 17 is a magnified view of FIG. 16.

FIG. 16 shows a measured transmission characteristic of the longitudinally coupled, multi-mode SAW filter of this embodiment. FIG. 17 shows it magnified central portion of the measured characteristic. This SAW filter is exactly identical in construction with Embodiment 1 except that M/L=1 as mentioned above. From FIG. 16 it can be seen that since the weighted area of each reflector is maximized by M/L=1, spurious pulses can be suppressed more than in the case of M/L=0.1 to 0.7.

Moreover, even if the two reflectors are weighted as if they were flipped vertically into triangular form, the spurious pulses can similarly be suppressed.

Embodiment 4

Figure 18:
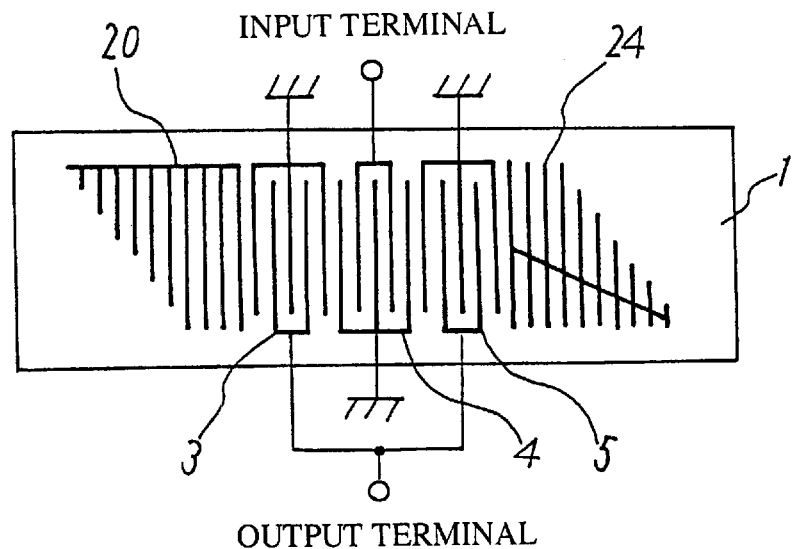
FIG. 18 is a diagram schematically illustrating another embodiment of the SAW filter according to the present invention.

FIG. 18 is a diagrammatic representation of a fourth embodiment (Embodiment 4) of the present invention. It is customary in the art that the electrodes of the IDTs and the reflectors are formed of aluminum (Al) and its alloys and are patterned into required form by wet or dry etching. In the case of wet etching, the electrodes are not clearly patterned because those portions in, for example, the reflectors 2 and 6 in FIG. 1 which are to be etched away are entirely surrounded by metal patterns.

To avoid this, the FIG. 1 embodiment uses three bus bars to short opposite ends of metal grating electrodes of the reflectors 2 and 6. On the other hand, Embodiment 4 uses a single bus bar to short the metal grating electrodes of each of reflectors 20 and 24—this prevents each reflector from being entirely surrounded by metal patterns, and hence it provides a structure easy for wet etching.

It is also apparent that even if the two reflectors on both sides of the IDT assembly are both weighted into such a shape as indicated by 20 or 24, an easy-to-wet-etch structure could similarly be obtained.

Moreover, it is evident that such easy-to-wet-etch structures could similarly be obtained using one bus bar to short the metal grating electrodes of each reflector in the embodiments of FIGS. 12 and 15.

Embodiment 5

Figure 19:
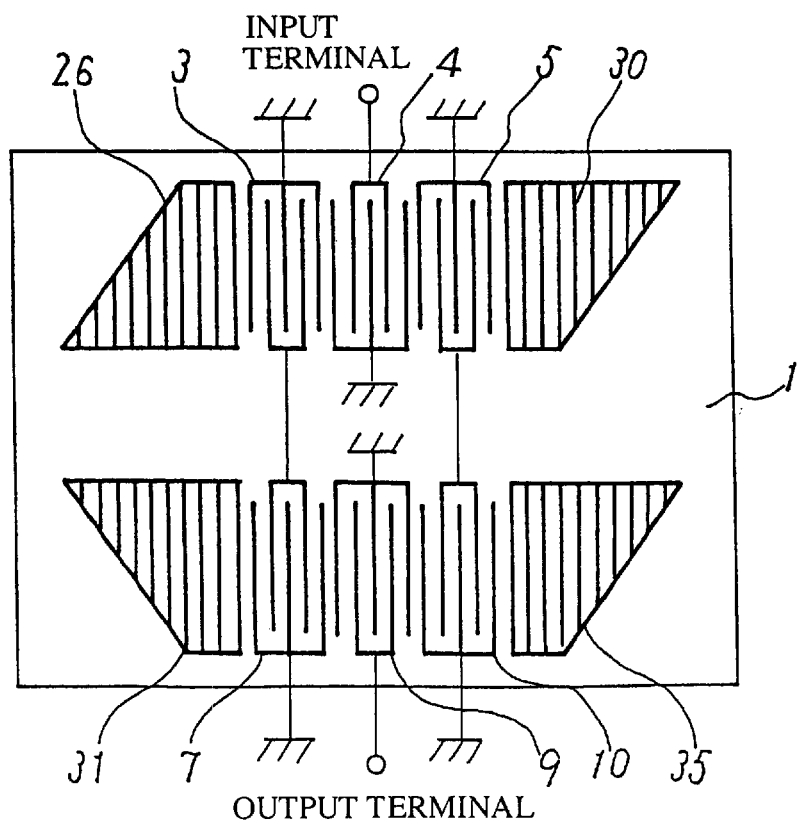
FIG. 19 is a diagram schematically illustrating still another embodiment of the SAW filter according to the present invention.

FIG. 19 is a diagrammatic showing of a fifth embodiment (Embodiment 5) of the present invention, which is a two-stage connection of 3-IDT-type longitudinally coupled, multi-mode SAW filters each having three IDTs and a reflector on either side of the IDT assembly. As previously referred to in connection with Embodiment 2, longitudinally coupled, multi-mode SAW filters having differently weighted reflectors generate spurious pulses of different shapes in the vicinity of the pass band. Accordingly, the electrodes of reflectors 26, 30 and 31, 35 of the two SAW filters in FIG. 19 are weighted differently from each other so that crests and troughs of spurious pulses in the two SAW filters cancel each other as much as possible. With multi-stage connection of such 3-IDT-type longitudinally coupled, multi-mode SAW filters, it is possible to further suppress the generation of spurious pulses in the overall transmission characteristic.

The same results could be obtained by a multi-stage connection of longitudinally coupled, multi-mode SAW filters having one or four or more IDTs.

It will be apparent that many modifications and variations may be effected without departing from the scope of the novel concepts of the present invention.

What is claimed is:

1. A longitudinally coupled surface acoustic wave filter comprising:

a piezoelectric substrate;

at least two interdigital transducers formed over the piezoelectric substrate; and reflectors disposed on both sides of said at least two interdigital transducers, wherein:

said reflectors each have at least a weighted portion including electrodes weighted so that a number of said electrodes varies linearly with a position in a direction perpendicular to a direction of propagation of surface acoustic waves, and bus bars for shorting said weighted electrodes, and a value of M/L is greater than or equal to 0.3, where M denotes a length of the weighted portion of a respective reflector in the direction of propagation of the surface acoustic waves, and L denotes a total length of the respective reflector in the direction of propagation of the surface acoustic waves.

2. The longitudinally coupled surface acoustic wave filter according to claim 1, wherein said each reflector has only one bus bar for shorting said electrodes.

3. A longitudinally coupled surface acoustic wave filter comprising a multi-stage connection of said filter of claim 1.

* * * * *